United States Patent
Doellgast et al.

(10) Patent No.: US 7,960,899 B2
(45) Date of Patent: Jun. 14, 2011

(54) PIEZOELECTRIC MULTILAYER COMPONENT WITH STRESSES RUNNING PERPENDICULAR TO STACKING DIRECTION

(75) Inventors: Bernhard Doellgast, Deutschlandsberg (AT); Alexander Glazunov, Deutschlandsberg (AT); Oliver Dernovsek, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/615,579

(22) Filed: Nov. 10, 2009

(65) Prior Publication Data
US 2010/0109488 A1 May 6, 2010

Related U.S. Application Data

(63) Continuation of application No. PCT/EP2008/055783, filed on May 9, 2008.

(30) Foreign Application Priority Data

May 11, 2007 (DE) .......................... 10 2007 022 093

(51) Int. Cl.
*H01L 41/083* (2006.01)
(52) U.S. Cl. .......................... 310/328; 310/365; 310/366
(58) Field of Classification Search .................. 310/328, 310/364–366
See application file for complete search history.

(56) References Cited

U.S. PATENT DOCUMENTS

| | | | |
|---|---|---|---|
| 6,162,313 A | 12/2000 | Bansemir et al. | |
| 6,512,323 B2 | 1/2003 | Forck et al. | |
| 6,710,519 B2 * | 3/2004 | Ogiura | 310/366 |
| 6,891,316 B2 | 5/2005 | Yuu et al. | |
| 7,070,674 B2 | 7/2006 | Kelley et al. | |
| 7,208,862 B2 | 4/2007 | Florian et al. | |
| 7,358,655 B2 | 4/2008 | Ragossnig et al. | |
| 7,449,077 B2 | 11/2008 | Heinzmann et al. | |
| 7,745,974 B2 * | 6/2010 | Goat et al. | 310/328 |
| 2004/0222719 A1 | 11/2004 | Sasaki et al. | |
| 2009/0026890 A1 * | 1/2009 | Goat et al. | 310/348 |

FOREIGN PATENT DOCUMENTS

| | | |
|---|---|---|
| DE | 197 32 513 A1 | 2/1999 |
| DE | 102 01 641 A1 | 8/2003 |
| DE | 102 34 787 C1 | 10/2003 |
| DE | 103 07 825 A1 | 9/2004 |
| DE | 10 2004 031 404 A1 | 2/2006 |
| DE | 10 2005 052 686 A1 | 2/2007 |
| EP | 1 263 060 A2 | 12/2002 |
| GB | 2 392 550 A | 3/2004 |
| WO | WO 2006/097522 A1 | 9/2006 |
| WO | WO 2007/138346 A1 | 12/2007 |

* cited by examiner

*Primary Examiner* — J. SanMartin
(74) *Attorney, Agent, or Firm* — Slater & Matsil, L.L.P.

(57) ABSTRACT

A piezoelectric multilayer component has a base body with a stack of piezoceramic layers and electrode layers arranged one on top of the other in an alternating manner. Neighboring layers of the stack are braced against one another such that stresses run perpendicular to the stacking direction.

29 Claims, 2 Drawing Sheets

PIEZOELECTRIC MULTILAYER COMPONENT WITH STRESSES RUNNING PERPENDICULAR TO STACKING DIRECTION

This application is a continuation of co-pending International Application No. PCT/EP2008/055783, filed May 9, 2008, which designated the United States and was not published in English, and which claims priority to German Application No. 10 2007 022 093.8 filed May 11, 2007, both of which applications are incorporated herein by reference.

TECHNICAL FIELD

The invention provides a piezoelectric multilayer component which forms a controlled crack under mechanical loading.

BACKGROUND

German Application No. 10 2004 031 404 A1 discloses a piezoelectric component with an actuator body, the actuator body having a predetermined breaking point which is formed in such a way that a crack allowed by the predetermined breaking point divides the actuator body into at least two part-stacks.

SUMMARY OF THE INVENTION

In one aspect, the invention provides a piezoelectric multilayer component that remains functional under permanent mechanical loading.

The invention provides a piezoelectric multilayer component with a stack of piezoceramic layers and electrode layers arranged one on top of the other in an alternating manner, neighboring layers of the stack being under angled mechanical stress with respect to one another in the lateral direction. The layers of the stack are accordingly braced against one another, the stresses or the bracing forces running perpendicular to the stacking direction.

It is preferred for the mutual bracing to be between neighboring piezoceramic layers. It may, however, also be produced between neighboring piezoceramic layers and electrode layers.

By means of the mechanical stress between the neighboring layers, the multilayer component can, under certain mechanical loads during its operation, form cracks that run substantially parallel to the layers. In other words, the stack may be partially divided in the lateral direction or come apart in the lateral direction as a result of the mechanical stresses that are present along at least one plane between the neighboring layers. If neighboring layers come apart from one another or begin to come apart from one another, they slip away from one another substantially in the lateral direction.

Such a piezoelectric multilayer component has a reduced risk of cracks or gaps occurring in an uncontrolled manner and running perpendicular to the layers and consequently, for example, a reduced risk of short-circuits being produced between electrode layers of the multilayer component. This allows the multilayer components to remain serviceable under constant loading over a longer period of time.

The following preferred ways allow the desired lateral mechanical stress between neighboring layers to be achieved.

According to one embodiment of the multilayer component, neighboring layers of the stack have, for example, different sintering shrinkage properties. During the sintering of the multilayer component, the desired mechanical stress between the layers is produced as a result of the different sintering shrinkage properties of the layers.

According to one embodiment of the piezoelectric multilayer component, different layers of the stack have different sintering shrinkage properties. For example, a first layer could have a higher sintering shrinkage at a first temperature than the neighboring layer at the same temperature. Sintering shrinkage is to be understood here as meaning the change in the dimensions of a layer in relation to the time that passes. This means that, within a time window at a certain temperature, where the time window may be very small, one layer contracts more than another layer. If the dimensions of a layer change during the sintering shrinkage, this may involve a change in volume of the layer.

According to one embodiment of the multilayer component, neighboring piezoceramic layers may have different sintering shrinkage properties. It is also possible for neighboring electrode layers and piezoceramic layers to be braced with respect to one another, in that, for example, the electrode layers contain not only an electrically conductive electrode material but also material that has different sintering shrinkage properties than the neighboring piezoceramic layer. This could be a ceramic material, in particular a piezoceramic material, the amount of this material for each electrode layer being relatively small in comparison with the metallic material of the electrode layer.

The neighboring layers preferably have different lateral sintering shrinkage properties. In this case, they laterally contract differently during the sintering operation. A combination of vertical and lateral sintering shrinkage properties likewise makes it possible to achieve the desired mechanical stress.

It has been experimentally found that different grain size distributions within the layers or different distributions of the sizes of the grains contained in the layers is also conducive to or causes the desired effect. These are ceramic grains, which may be contained not only in piezoceramic layers but also in electrode layers.

According to one embodiment of the piezoelectric multilayer component, the materials of neighboring layers of the stack have different calcination temperatures. It has been found that this property is conducive to the achievement of the desired mechanical stress. It has been observed in particular that different calcination temperatures of the materials of neighboring layers influence their respective sintering shrinkage.

According to one embodiment, the neighboring layers contain different dopants, which are conducive to the achievement of the desired mechanical stress between them. It has been observed in particular that different dopants influence their respective sintering shrinkage properties. In addition, neighboring layers may contain different sintering aids. For example, one layer, which is braced against a neighboring layer in the way described could contain a material comprising PbO or SnO as a sintering aid or as a dopant. The layer could also, for example, contain a material comprising PbO or SnO and, for example, $SiO_2$ or a solidifiable liquid phase of one of these materials or material combinations.

The invention also provides a method for producing a piezoelectric multilayer component, different ceramic mixtures, which preferably each include a PZT ceramic, being prepared. The ceramic mixtures are prepared with ceramic grains of different sizes. The grain sizes or the diameters of the grains preferably differ from one another in this case by a multiple. Consequently, ceramic mixtures that have different grain size distributions are created.

To make it easier for them to be formed into sheets, the ceramic mixtures may contain organic binders, which can later be removed in a debinding process. Furthermore, different dopants or dopant concentrations may be admixed with the ceramic mixtures, whereby the sintering shrinkage properties of the ceramic mixtures can be further influenced.

The ceramic mixtures are processed into green sheets. These are printed with electrode layers. A preferred electrode material is copper; silver and palladium or an alloy of at least two of these materials can likewise be used as electrode material. The green sheets are subsequently cut to size and stacked one on top of the other, so that neighboring layers of the stack have different grain size distributions.

A still green multilayer component fabricated in this way is subsequently debinded, wherein any binder still present in the green sheets is volatized or the green sheets are decarburized. The multilayer component can subsequently be sintered to form a monolithic component.

During the sintering operation, the layers of the multilayer component have different sintering shrinkage properties. Consequently, they contract to differing degrees during the sintering operation. This means that, over a sintering time period ST in which, for example, a constant temperature Temp0 is maintained, the layers contract at different rates, so that this may already cause mechanical stresses to be produced. If, on the other hand, the temperature changes over a sintering time period ST, this process can be modulated still further.

For example, at a temperature Temp1 in a time window $ST_{t1+\delta t}$ within the time window ST, the first layer loses x % of its pre-sintering volume, whereas a second neighboring layer loses y % of its pre-sintering volume. Within a later time period $ST_{t2+\delta t}$, at a different temperature Temp2, the first layer could lose u % of its pre-sintering volume, whereas the second neighboring layer loses w % of its pre-sintering volume.

Altogether, the temperatures to which the multilayer component is exposed are controlled over a sintering time period in such a way that preferably each layer has reached its desired form in the sintered and cooled state of the multilayer component, irrespective of the way in which this is achieved. In particular, the forms or lateral extents of the layers of the stack in the final state are comparable to one another in such a way that a multilayer component that has outer surfaces that are as planar as possible is produced. In the case of rectangular layers, for example, a cuboidal stack with planar side faces should be thereby produced.

BRIEF DESCRIPTION OF THE DRAWINGS

The subjects described are explained in more detail on the basis of exemplary embodiments and the following figures, in which.

DETAILED DESCRIPTION OF THE ILLUSTRATIVE EMBODIMENTS

Figure 1:
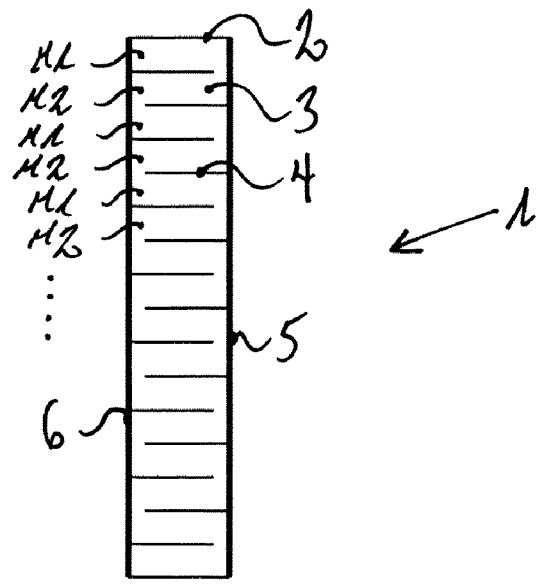
FIG. 1 shows a piezoelectric multilayer component.

FIG. 1 shows a piezoelectric multilayer component 1 with a base body 2, which includes a stack of piezoceramic layers 3 and electrode layers 4 arranged one on top of the other. Outer electrical contacts 5 and 6, which extend in the longitudinal direction and serve for the electrical contacting of the component, have been applied to two outer surfaces of the base body 2. The electrode layers 4 may contain copper, palladium and/or silver or an alloy of a number of these materials.

By means of different material compositions M1 and M2, neighboring piezoelectric layers 3 have different sintering shrinkage properties. Piezoceramic layers 3 with different material compositions are stacked one on top of the other in an alternating manner, i.e., in the sequence M1, M2, M1, M2. It has been found to be favorable, for example, if the material compositions of neighboring piezoceramic layers are chosen such that their calcination temperatures differ by between 120° C. and 80° C., in particular by approximately 100° C. In addition or alternatively, the grain sizes or diameters of the piezoceramic grains of neighboring layers could differ between 1.1 μm and 1.6 μm, although each layer could have its own grain size distribution with a variance of a few tenths of a μm. For example, the grains of a layer M1 could have diameters of between 0.4 μm and 0.6 μm and the grains of a neighboring layer M2 could have diameters of between 1.5 μm and 2.2 μm. A layer M2 may have a grain size distribution with larger grains than a layer M1 neighboring it.

Figure 2:
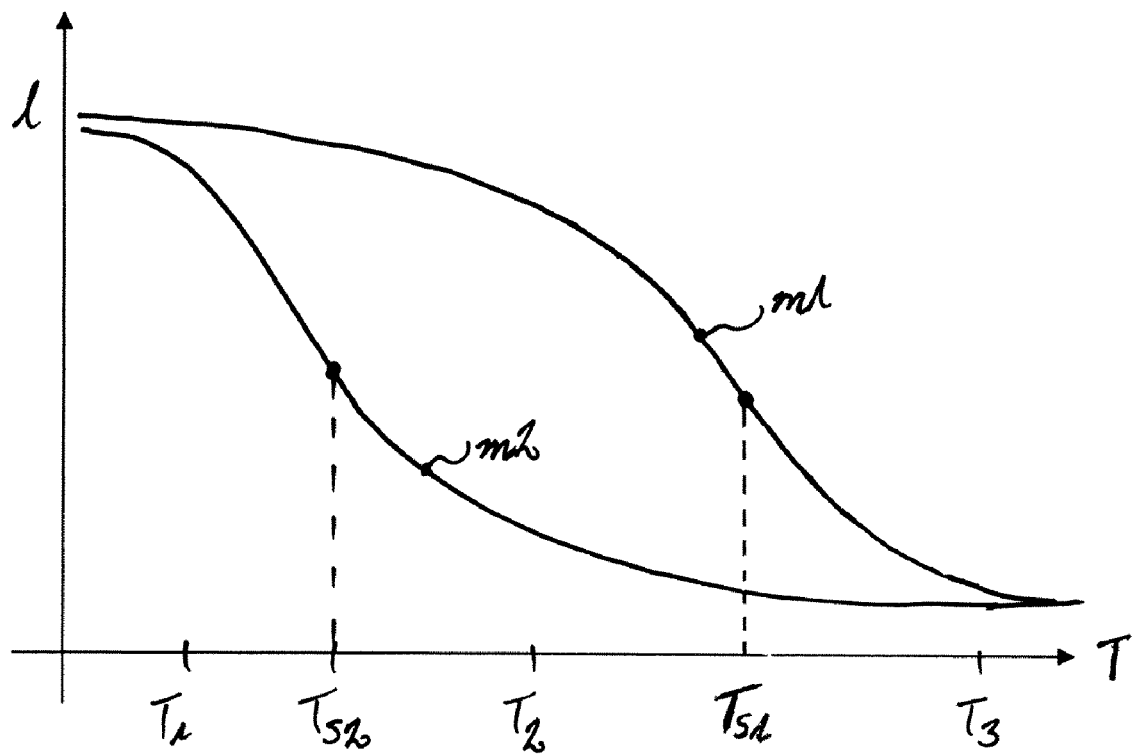
FIG. 2 shows the sintering shrinkage of different ceramic mixtures as a function of temperature.

FIG. 2 shows a graph with two curves m1 and m2, which respectively represent the temperature-dependent sintering shrinkage property of piezoceramic layers 3 with a material composition M1 and M2. The curve m1 shows how the lateral dimension l of a piezoceramic layer 3 with a material composition M1 decreases as a function of increasing temperature. At a temperature $T_1$, the sintering shrinkage process begins, and a maximum sintering shrinkage of the piezoceramic layer 3 with the material composition M1 is reached at a temperature $T_{S2}$. At this temperature, the change in the lateral dimension l in relation to the temperature reaches its maximum. After that, the lateral dimension of the piezoceramic layer becomes less, until at a temperature $T_3$ there is virtually no longer any discernible change in the lateral dimension.

The curve m2 shows how the lateral dimension l of a piezoceramic layer 3 with the material composition M2 decreases as a function of increasing temperature. At a temperature $T_1$, the sintering shrinkage process begins and a maximum sintering shrinkage of the piezoceramic layer 3 with the material composition M2 is reached at a temperature $T_{S1}$. At the maximum sintering temperature, the change in the lateral dimension l in relation to the temperature reaches its maximum. After that, the lateral dimension of the piezoceramic layer does become less, but less rapidly. At a temperature $T_3$, there is no longer any discernible change, or at least virtually no discernible change, in the lateral dimension.

Figure 3:
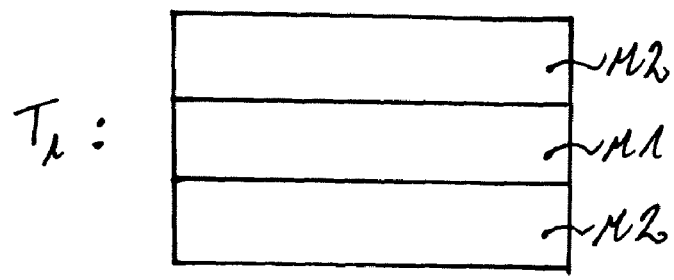
FIG. 3 shows the geometrical relationship of neighboring layers at a first temperature.

FIG. 3 shows a stack of three schematically represented piezoceramic layers before a sintering operation. The uppermost layer and the lowermost layer according to the representation have the same material compositions M2. A piezoceramic layer arranged between these layers has a different material composition M1, which differs in its sintering shrinkage properties from those of the neighboring layers. The representation indicates the state of the layers when they have been exposed to a temperature $T_1$ leading to sintering shrinkage.

Figure 4:
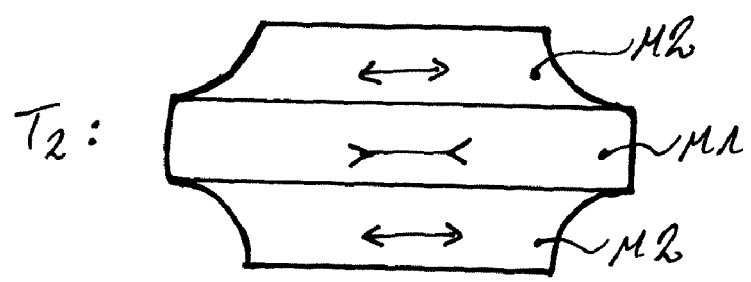
FIG. 4 shows the geometrical relationship and the different sintering shrinkage behavior of neighboring layers at a second temperature.

FIG. 4 shows the stack from FIG. 3 at a different temperature $T_2$ (also see in this respect FIG. 2), the layers with the material compositions M2 having a greater sintering shrinkage than the layer lying between them with the material composition M1. Therefore, the layers M2 are shown with a smaller lateral dimension than in the case of the layer M1. The arrows respectively shown in the layers indicate tensile or compressive loads. As a result of the slower sintering shrinkage of the middle layer M1 in comparison with its adjacent layers, a tensile force acts on the adjacent layers with the material composition M2. This is shown by outwardly pointing arrows. The converse case applies to the middle layer: as a result of the greater sintering shrinkage of its adjacent layers, the middle layer M1 is drawn along with them, or an inwardly acting compressive force acts on the middle layer.

The mechanical stresses caused by the different sintering behavior of neighboring layers leads to mechanically less stable interfacial regions between the layers.

Figure 5:
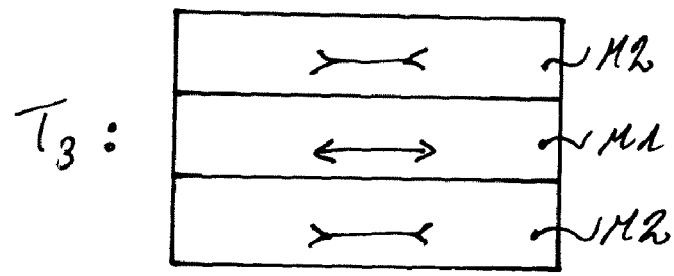
FIG. 5 shows the geometrical relationship and the different sintering shrinkage behavior of neighboring layers at a third temperature.

FIG. 5 shows the stack from FIGS. 3 and 4 at another temperature $T_3$ (also see in this respect FIG. 2), a reverse effect in comparison with FIG. 4 having already occurred by this point in time. Since the exposure of the stack to the previous temperature $T_2$ and up to and including the temperature $T_3$, the layers with the material compositions M2 have a lower sintering shrinkage than the layer lying between them with the material composition M1. As a result of the more rapid sintering shrinkage of the middle layer M1 in comparison with its adjacent layers, a compressive force acts on the adjacent layers with the material composition M2. This is shown by inwardly pointing arrows. The converse case applies to the middle layer: as a result of the slower sintering shrinkage of its adjacent layers, the middle layer M1 is slowed in its tendency to draw itself inward by the layer adjacent to it, or an outwardly acting compressive force acts on the middle layer M1.

As explained above, up to a temperature $T_3$, the mutual effects of the different lateral contractions of the layers have had the effect that a stack that is planar on its outer surface, i.e., a stack with a uniform outline extending over the height of the stack, is created. At this point in time, however, material-weakened interfaces or interfacial regions have been produced between the individual layers of the piezo actuator, allowing the formation of a controlled crack, running parallel to the layers, in the case of certain tensile loads of a piezo actuator that is put into operation.

The following list of reference symbols can be used in conjunction with the drawings 1 piezoelectric component
2 base body
3 piezoceramic layer
4 electrode layer
5 first outer contact
6 second outer contact
T1 to T3 different temperatures
M1 first material composition
M2 second material composition
m1 sintering shrinkage behavior of the first material composition
m2 sintering shrinkage behavior of the second material composition

What is claimed is:

1. A piezoelectric multilayer component comprising a base body with a stack of piezoceramic layers and electrode layers arranged one on top of the other in an alternating manner, neighboring layers of the stack being braced against one another such that stresses run perpendicular to the stacking direction, wherein neighboring layers have different ceramic grain size distributions.

2. The piezoelectric multilayer component as claimed in claim 1, wherein the neighboring layers are under tensile stress with respect to one another.

3. The piezoelectric multilayer component as claimed in claim 1, wherein a piezoceramic layer, which is arranged between two further piezoceramic layers, is braced against these further layers.

4. The piezoelectric multilayer component as claimed in claim 1, wherein neighboring layers of the stack have different sintering shrinkage properties.

5. The piezoelectric multilayer component as claimed in claim 4, wherein the neighboring layers contain different dopants, which influence their respective sintering shrinkage property.

6. The piezoelectric multilayer component as claimed in claim 1, wherein the piezoelectric multilayer component has outer surfaces that are substantially planar.

7. The piezoelectric multilayer component as claimed in claim 1, wherein materials of neighboring piezoceramic layers have different calcination temperatures.

8. The piezoelectric multilayer component as claimed in claim 1, wherein the neighboring layers contain different dopants, which influence relative mechanical stress between them.

9. The piezoelectric multilayer component as claimed in claim 1, wherein neighboring layers contain different sintering aids.

10. A piezoelectric multilayer component comprising a base body with a stack of piezoceramic layers and electrode layers arranged one on top of the other in an alternating manner, neighboring layers of the stack being braced against one another such that stresses run perpendicular to the stacking direction, wherein materials of neighboring piezoceramic layers have different calcination temperatures.

11. The piezoelectric multilayer component as claimed in claim 10, wherein the calcination temperatures of the materials of neighboring piezoceramic layers differ by between 80° C. and 120° C.

12. A piezoelectric multilayer component comprising a base body with a stack of piezoceramic layers and electrode layers arranged one on top of the other in an alternating manner, neighboring layers of the stack being braced against one another such that stresses run perpendicular to the stacking direction, wherein the neighboring layers contain different dopants, which influence relative mechanical stress between them.

13. A piezoelectric multilayer component comprising a base body with a stack of piezoceramic layers and electrode layers arranged one on top of the other in an alternating manner, neighboring layers of the stack being braced against one another such that stresses run perpendicular to the stacking direction, wherein neighboring layers of the stack have different sintering shrinkage properties and wherein the neighboring layers contain different dopants that influence their respective sintering shrinkage property.

14. A piezoelectric multilayer component comprising a base body with a stack of piezoceramic layers and electrode layers arranged one on top of the other in an alternating manner, neighboring layers of the stack being braced against one another such that stresses run perpendicular to the stacking direction, wherein neighboring layers contain different sintering aids.

15. A piezoelectric multilayer component comprising a base body with a stack of piezoceramic layers and electrode layers arranged one on top of the other in an alternating manner, neighboring layers of the stack being braced against one another such that stresses run perpendicular to the stacking direction, wherein neighboring piezoceramic layers of the stack have different sintering shrinkage properties.

16. A method of forming a piezoelectric multilayer component, the method comprising:
 forming a base body with a stack of piezoceramic layers and electrode layers arranged one on top of the other in an alternating manner;
 wherein neighboring layers of the stack are braced against one another such that stresses run perpendicular to the stacking direction, wherein neighboring layers have different ceramic grain size distributions.

17. The method of claim 16, wherein forming the stack comprises:
 preparing different piezoceramic mixtures with ceramic grains of different sizes;
 admixing a binder with the different piezoceramic mixtures;
 processing the different piezoceramic mixtures into different green sheets;
 printing the green sheets with electrode layers;
 cutting the green sheets printed with electrode layers to size and stacking one on top of the other to form a stack in such a way that neighboring layers of the stack have different grain size distributions;
 debinding the stack; and
 subsequently sintering the stack to form a monolithic component, wherein, during the sintering, the layers of the stack undergo different sintering shrinkages.

18. The method as claimed in claim 17, wherein sintering the stack comprises exposing the stack to temperatures that are controlled over a sintering time period in such a way that each layer has reached a form in the sintered and cooled state of the stack such that lateral extents of the layers are comparable in such a way that a stack that has substantially planar outer surfaces is produced.

19. The method as claimed in claim 17, wherein the material compositions of neighboring piezoceramic layers are chosen such that their calcination temperatures differ by between 80° C. and 120° C.

20. The method as claimed in claim 17, wherein preparing piezoceramic mixtures comprises preparing the piezoelectric mixtures such that the grain sizes of neighboring piezoceramic layers differ by between 1.1 μm and 1.6 μm.

21. The method as claimed in claim 17, further comprising forming outer electrical contacts along outer surfaces of the base body.

22. The method as claimed in claim 17, wherein sintering the stack to form a monolithic component comprises forming a component comprising a base body with a stack of piezoceramic layers and electrode layers arranged one on top of the other in an alternating manner, neighboring layers of the stack being braced against one another such that stresses run perpendicular to the stacking direction.

23. The method as claimed in claim 22, wherein the neighboring layers are under tensile stress with respect to one another.

24. The method as claimed in claim 16, wherein, after forming the stack, the method further comprises sintering the stack to brace the neighboring layers of the stack against one another such that stresses run perpendicular to the stacking direction.

25. A method of forming a piezoelectric multilayer component, the method comprising:
 forming a base body with a stack of piezoceramic layers and electrode layers arranged one on top of the other in an alternating manner;
 wherein neighboring layers of the stack are braced against one another such that stresses run perpendicular to the stacking direction, wherein materials of neighboring piezoceramic layers have different calcination temperatures.

26. A method of forming a piezoelectric multilayer component, the method comprising:
 forming a base body with a stack of piezoceramic layers and electrode layers arranged one on top of the other in an alternating manner;
 wherein neighboring layers of the stack are braced against one another such that stresses run perpendicular to the stacking direction, wherein the neighboring layers contain different dopants, which influence relative mechanical stress between them.

27. A method of forming a piezoelectric multilayer component, the method comprising:
 forming a base body with a stack of piezoceramic layers and electrode layers arranged one on top of the other in an alternating manner;
 wherein neighboring layers of the stack are braced against one another such that stresses run perpendicular to the stacking direction, wherein neighboring layers of the stack have different sintering shrinkage properties and wherein the neighboring layers contain different dopants that influence their respective sintering shrinkage property.

28. A method of forming a piezoelectric multilayer component, the method comprising:
 forming a base body with a stack of piezoceramic layers and electrode layers arranged one on top of the other in an alternating manner;
 wherein neighboring layers of the stack are braced against one another such that stresses run perpendicular to the stacking direction, wherein neighboring layers contain different sintering aids.

29. A method of forming a piezoelectric multilayer component, the method comprising:
 forming a base body with a stack of piezoceramic layers and electrode layers arranged one on top of the other in an alternating manner;
 wherein neighboring layers of the stack are braced against one another such that stresses run perpendicular to the stacking direction, wherein neighboring piezoceramic layers of the stack have different sintering shrinkage properties.

* * * * *